United States Patent
Hahn et al.

(10) Patent No.: US 7,110,292 B2
(45) Date of Patent: Sep. 19, 2006

(54) PROGRAMMING CIRCUITS AND METHODS FOR MULTIMODE NON-VOLATILE MEMORY DEVICES

(75) Inventors: Wook-Ghee Hahn, Gyeonggi-do (KR); Sung-Soo Lee, Gyeonggi-do (KR); Dae-Seok Byeon, Gyeonggi-do (KR)

(73) Assignee: Samsung Electronics Co., Ltd., (KR)

( * ) Notice: Subject to any disclaimer, the term of this patent is extended or adjusted under 35 U.S.C. 154(b) by 98 days.

(21) Appl. No.: 11/020,517

(22) Filed: Dec. 22, 2004

(65) Prior Publication Data

US 2006/0044923 A1 Mar. 2, 2006

(30) Foreign Application Priority Data

Sep. 2, 2004 (KR) .................... 10-2004-0069926

(51) Int. Cl.
G11C 11/34 (2006.01)
G11C 16/04 (2006.01)

(52) U.S. Cl. .................... 365/185.03; 365/185.19; 365/185.23; 365/230.06

(58) Field of Classification Search .......... 365/185.03, 365/185.19, 185.23, 230.06
See application file for complete search history.

(56) References Cited

U.S. PATENT DOCUMENTS

| | | | |
|---|---|---|---|
| 5,642,309 A | 6/1997 | Kim et al. | |
| 6,067,248 A | 5/2000 | Yoo | |
| 6,097,637 A | 8/2000 | Bauer et al. | |
| 6,191,977 B1 * | 2/2001 | Lee | 365/185.21 |
| 6,469,933 B1 | 10/2002 | Choi et al. | |
| 6,552,929 B1 * | 4/2003 | Parker | 365/185.03 |
| 6,822,909 B1 * | 11/2004 | Hamilton et al. | 365/185.28 |
| 2002/0060926 A1 | 5/2002 | Choi et al. | |

FOREIGN PATENT DOCUMENTS

| | | |
|---|---|---|
| KR | 2001-0037694 A | 5/2001 |
| KR | 2001-210082 A | 8/2001 |
| KR | 2003-0023349 A | 3/2003 |

\* cited by examiner

*Primary Examiner*—Richard Elms
*Assistant Examiner*—Toan Le
(74) *Attorney, Agent, or Firm*—Myers Bigel Sibley & Sajovec, P.A.

(57) ABSTRACT

A non-volatile memory device includes non-volatile memory cells, a respective one of which is configured to store a single bit in a single bit mode, and to store more than one bit in a multi-bit mode. A single voltage divider is configured to generate at a least a first program voltage for the non-volatile memory cells in the single bit mode, and to generate at least a second program voltage that is different from the first program voltage, for the non-volatile memory cells in the multi-bit mode.

27 Claims, 5 Drawing Sheets

PROGRAMMING CIRCUITS AND METHODS FOR MULTIMODE NON-VOLATILE MEMORY DEVICES

RELATED APPLICATION

This application claims the benefit under 35 USC § 119 of Korean Patent Application No. 2004-0069926, filed on Sep. 2, 2004, the disclosure of which is hereby incorporated herein by reference in its entirety as if set forth fully herein.

FIELD OF THE INVENTION

This invention generally relates to memory devices and, more specifically, to non-volatile memory devices and programming systems and methods thereof.

BACKGROUND OF THE INVENTION

A variety of applications have been developed wherein it is desirable to utilize a non-volatile integrated circuit (semiconductor) memory device that is electrically erasable and programmable but which does not require a refresh of stored data. Research has further been directed to providing an increase in storage capacitance and integrity of data storage in such non-volatile memory devices. One example of non-volatile memory devices that may provide large capacity and high data integrity without refresh of the stored data is a NAND-type flash memory device. Because data is maintained even when power is turned off, such flash memory devices have been widely used in a variety of electronic devices (e.g., hand held terminals, portable computers, etc.) where there is a risk of unexpected power loss (such as from turning off the device).

In such non-volatile memory devices, Incremental Step Pulse Programming (ISPP) has been used in order to control a program voltage profile. According to this programming method, a program voltage (also referred to herein as a word line voltage) is increased stepwise depending on a repetition of program loops of a program cycle. As is well-known, the program loops include a program section and a program verification section. The program voltage is increased by pre-set increments. In accordance with the above-mentioned ISPP mode, a threshold voltage of a cell programmed in a program operation may be increased by one or more increments set in the program loops. In order to narrow a threshold voltage profile of a finally programmed cell, it may be desirable to set an increment of a program voltage. The smaller the increment of the program voltage is, the larger the a number of a program loops a program cycle may have. Accordingly, the number of the program loops may be determined to obtain the most suitable threshold voltage profile without unduly limiting a performance of a memory device.

Circuits for generating program voltages according to ISPP mode are disclosed in U.S. Pat. No. 5,642,309 entitled "Auto-Program Circuit In A Nonvolatile Semiconductor Memory Device" and U.S. Pat. No. 6,469,933 entitled "Flash Memory Device Capable of Preventing Program Disturb and Method for Programming the Same", assigned to the assignee of the present invention, the disclosures of which are hereby incorporated herein by reference in their entirety as if set forth fully herein. The programming voltages may be generated by a voltage divider that is connected to an output node, as denoted by 36 in FIG. 1 of the '309 patent.

In non-volatile memory devices, multi-level data (also referred to as "multi-bit data") or single-level data (also referred to as "single-bit data") may be stored in one memory cell. It may be desirable to differently set an increment of a word line voltage used in programming the multi-level data (also referred to as a multi-level program mode) and an increment of a word line voltage used in programming the single-level data (also referred to as a single-level program mode). For example, word line voltages may increase as much as 0.2V every program loop in programming multi-level data. In contrast, word line voltages may increase as much as 0.8V every program loop in programming single-level data. In order to increase word line voltages, a voltage divider is provided in a word line generator circuit. An example of a voltage divider for a single mode non-volatile memory device is shown in FIG. 1 of the above-mentioned U.S. Pat. No. 5,642,309. A multi-level non-volatile memory device is described in U.S. Pat. No. 6,067,248 entitled "Nonvolatile Semiconductor Memory With Single-Bit and Multi-Bit Modes of Operation and Method for Performing Programming and Reading Operations Therein", assigned to the assignee of the present invention, the disclosure of which is hereby incorporated herein by reference in its entirety as if set forth fully herein.

SUMMARY OF THE INVENTION

Non-volatile memory devices according to some embodiments of the present invention include a plurality of non-volatile memory cells, a respective one of which is configured to store a single bit in a single bit mode, and to store more than one bit in a multi-bit mode. A programming circuit is configured to program the non-volatile memory cells using a first series of sequentially increasing program voltage steps in a single bit mode, and a second series of sequentially increasing program voltage steps in the multi-bit mode. In some embodiments, the programming circuit includes a single voltage divider that is configured to generate the first series of sequentially increasing program voltage steps in the single bit mode, and to generate the second series of sequentially increasing program voltage steps in the multi-bit mode. In other embodiments, a single voltage divider is configured to generate at least a first program voltage for the non-volatile memory cells in the single bit mode, and to generate a second program voltage that is different from the first program voltage for the non-volatile memory cells in the multi-bit mode. Analogous methods of programming non-volatile memory devices also may be provided.

According to other embodiments of the present invention, there is provided a non-volatile memory device in which a word line voltage generator circuit is configured to generate a word line voltage in response to step control signals. A word line voltage control circuit is configured to control an activation step of the step control signals such that an increment of the word line voltage is changed by the word line voltage generator circuit according to multi-level and single-level program modes of the non-volatile memory device.

In some embodiments, the activation step of the step control signals is set to "1" or "N", where N is an integer greater than 1, during the multi-level program mode or the single-level program mode, respectively, such that the increment of the word line voltage is changed according to the multi-level and single level program modes. In these embodiments, the word line voltage generator circuit can include a single voltage divider that is configured to divide the word line voltage during the multi-level and the single-level program modes. The single voltage divider may be responsive to the step control signals. The word line voltage may increase stepwise whenever program loops of a program cycle are repeated. Moreover, the increment of the word line voltage in the single-level program mode may be larger than the increment of the word line in the multi-level program mode.

In other embodiments of the present invention, there is provided a non-volatile memory device in which a word line voltage generator circuit is configured to generate a word line voltage in response to step control signals. A step control circuit is configured to generate a step counter-up signal in response to a loop pulse signal indicating pass/fail of a program loop. A step control generator circuit is configured to sequentially activate the step control signals in response to a transition of the step counter-up signal, wherein the loop pulse signal is successively transitioned at one or N, where N is an integer greater than 1, times, when the program loop is ended so that an increment of the word line voltage is changed by the word line voltage generator circuit according to the program mode of the non-volatile memory device.

In these embodiments, the word line voltage generator circuit can include a single voltage divider that is configured to divide the word line voltage in a multi-level program mode and a single-level program mode. The single voltage divider may be responsive to the step control signals. The word line voltage may increase stepwise whenever program loops of a program cycle are repeated. Moreover, the increment of the word line in a single program mode may be larger than the increment of the word line voltage in a multi-level program mode, and the step control circuit may be configured to set the increment of the word line voltage that is generated in a single-level program mode.

Moreover, the step control circuit can include an oscillator that is configured to generate an oscillation signal in response to an end of a program loop. A counter is configured to perform a count operation in response to the oscillation signal. A detector is configured to deactivate the oscillator when an output of the counter reaches a target value. Finally, a selector is configured to output an oscillation signal as the step counter-up signal, wherein the oscillation signal is generated during operation of the oscillator in the single-level program mode. The selector can output the loop pulse signal as the step counter-up signal in the multi-level program mode. The step control circuit can further include an initial value set circuit configured to set an initial value of the counter. The initial value set circuit can comprise a fuse circuit that is programmed to store the initial value. Finally, the loop pulse signal can transition when the program loop is ended.

A non-volatile memory device according to various embodiments of the invention can further include an array of memory cells arranged in row and columns. A row decoder circuit is configured to provide the word line voltage to one of the rows. A data read circuit is configured to read data from the array during a program verification of a program loop. A pass/fail check circuit is configured to determine a pass/fail of the program loop in response to the read data. Control logic is configured to generate the loop pulse signal in response to an output of the pass/fail check circuit.

In still other embodiments of the present invention, methods for controlling a word line voltage of a non-volatile memory device include generating a step counter-up signal in response to a loop pulse signal indicating a pass/fail of a program loop, sequentially activating step control signals in response to a transition of the step counter-up signal and generating a word line voltage in response to the step control signals. The loop pulse signal is successively transitioned at one or N (where N is 1 or an integer greater than 1) time according to a program mode when a program loop is ended such that an increment of a word line is changed according to the program mode. The program mode can include a multi-level program mode and a single-level program mode.

DETAILED DESCRIPTION

The invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It also will be understood that, as used herein, the terms "row" or "horizontal" and "column" or "vertical" indicate two relative non-parallel directions that may be orthogonal to one another. However, these terms do not require an absolute horizontal or vertical orientation as shown in the figures.

Figure 1:
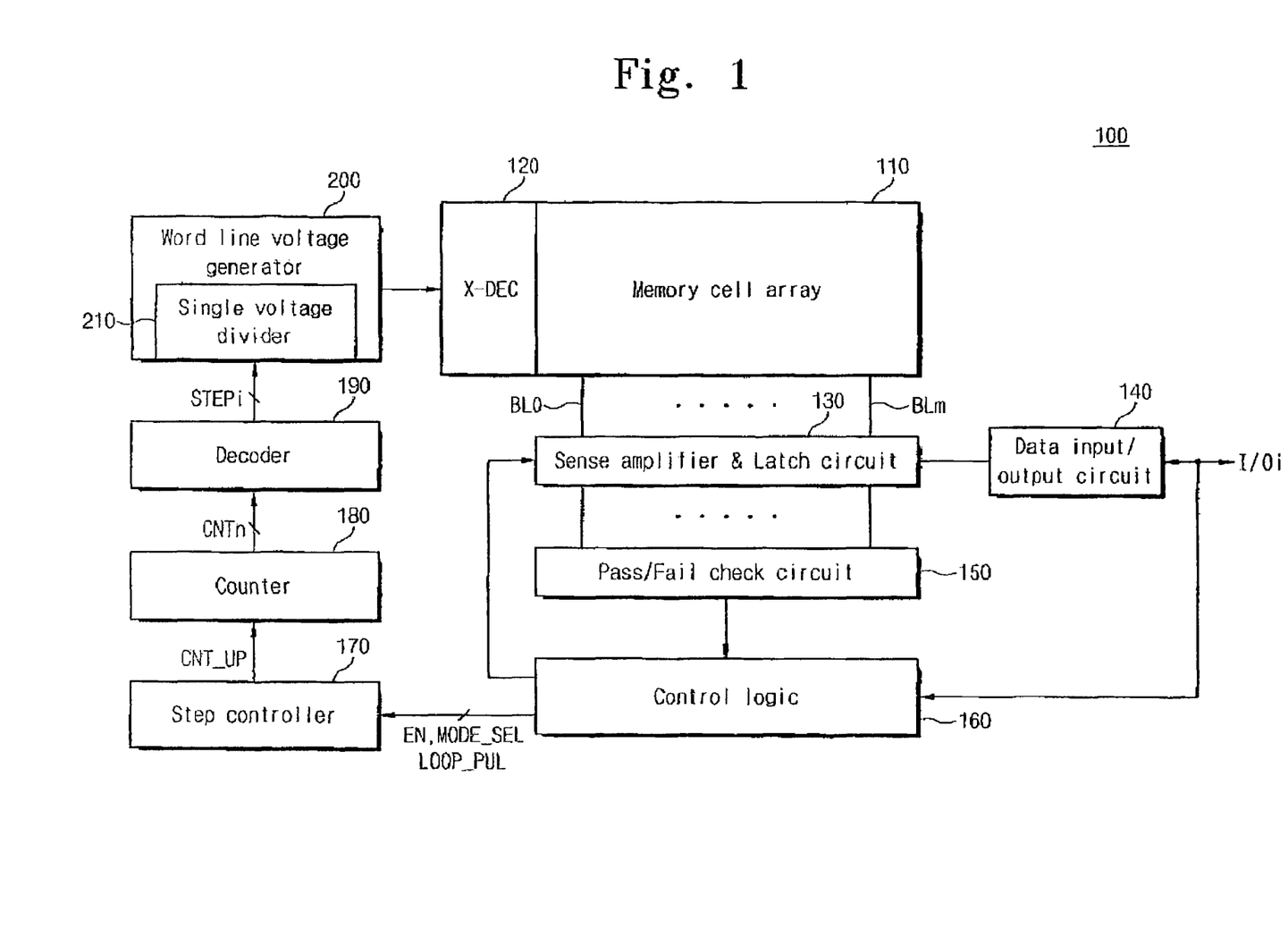
FIG. 1 is a block diagram of a non-volatile memory device according to various embodiments of the present invention.

FIG. 1 is a block diagram of a non-volatile memory device according to various embodiments of the present invention. With reference to FIG. 1, the non-volatile memory device 100 is illustrated as a flash memory device. However, it is to be understood in those skilled in the art that the present invention is applicable to other non-volatile memory devices (MROM, PROM, FRAM, etc).

A non-volatile memory device 100 according to some embodiments of the present invention includes a memory cell array 110, which is arranged in a matrix shape of rows (or word lines) and columns (or bit lines). Each of memory cells stores 1-bit data or n-bit data (where, n is 2 or an integer higher than 2). In addition, in some embodiments, 1-bit data is stored in some of the memory cells, and n-bit data is stored in the rest of the memory cells. In other words, a non-volatile memory device 100 according to various embodiments of the present invention can be structured to store multi-level data and single-level data. A row selection circuit (or a row decoder circuit) 120 selects at least one row in response to a row address and then drives the selected row as a word line voltage from a word line voltage generator circuit 200. A sense amplification and latch circuit 130 is controlled by control logic 160 and reads 1-bit or n-bit data from the memory cell array 110 in a read/verification operation. The read data during the read operation is output externally through a data input/output circuit 140. The read data during the verification operation is output to a pass/fail check circuit 150. The sense amplification and latch circuit 130 receives data to be written in the memory cell array 110 in a program operation through the data input/output circuit 140 and respectively drives bit lines as a program voltage (e.g., a ground voltage) or a program inhibition voltage (e.g., a power supply voltage) according to input data. Exemplary sense amplification and latch circuits for storing multi-level data and single-level data are disclosed in the above-cited U.S. Pat. No. 6,067,248.

The pass/fail check circuit 150 detects whether data values output from the sense amplification and latch circuit 130 in a program/erase verification operation have the same data (e.g., a pass data value) or not. Then, as a detection result, the pass/fail check circuit 150 outputs pass/fail information to the control logic 160. The control logic 160 activates a word line voltage generator circuit 200 in response to a command for indicating a program cycle. In this case, the command may be provided by input/output pins. In addition, the control logic 160 controls the sense amplification and latch circuit 130 during each program loop of a program cycle. The control logic 160 activates a loop pulse signal LOOP_PUL in response to pass/fail information from the pass/fail check circuit 150. For example, when the pass/fail information includes at least one data value output from the sense amplification and latch circuit 130, the control logic 160 activates the loop pulse signal LOOP_PUL. That is, if the present program loop is detected as a program fail, the control logic 160 activates the loop pulse signal LOOP_PUL as a pulse. In contrast, when the present program loop is detected as a program pass, the control logic 160 deactivates the loop pulse signal LOOP_PUL and ends a program cycle. Additionally, the control logic 160 generates a mode selection signal MODE_SEL representing a program mode. The program mode has a multi-level program mode and a single-level program mode. The control logic 160 activates an enable signal EN whenever a program loop is ended. After a predetermined time passes, the control logic 160 deactivates the activated enable signal EN.

Still referring to FIG. 1, a step control circuit 170 generates a step counter-up signal CNT_UP in response to an enable signal EN, a mode selection signal MODE_SEL, and the loop pulse signal LOOP_PUL. The step counter-up signal CNT_UP is transitioned at one time or at successive N times according to a program mode whenever a program loop is ended. For instance, during the multi-level program mode, the step counter-up signal CNT_UP is transitioned at one time when the program loop is ended. In other words, the step counter-up signal CNT_UP is activated as a pulse one time when the program loop is ended. In contrast, during the single-level program mode, the step counter-up signal CNT_UP is successively transitioned as a pulse at N times (where, N is 2 or an integer greater than 2) when the program loop is ended. This is more fully described hereinafter.

A step counter circuit 180 performs a count operation in response to a transition of the step counter-up signal CNT_UP (e.g., a low-high transition or a high-low transition). Since the step counter-up signal CNT_UP is transitioned at only one time in a multi-level program mode when the program loop is ended, an output value of the step counter circuit 180 is increased by 1. In contrast, since the step counter-up signal CNT_UP is successively transitioned at N times in a single-level program mode when the program loop is ended, an output value of the step counter circuit 180 is increased by N. A decoder circuit 190 decodes the output of the step counter circuit 180 to generate a step control signal STEPi. For instance, assuming that a step control signal STEP0 is activated in the first program loop (where N=3), a step control signal STEP1 may be activated in the following program loop in the multi-level program mode. In contrast, in the single-level program mode, a step control signal STEP3 may be activated in the following program loop.

The word line voltage generator circuit 200 generates a word line voltage in response to step control signals STEPi and includes a single voltage divider 210 that is controlled by the step control signals STEPi. The single voltage divider 210 is structured to divide a word line voltage in response to the step control signals STEPi in a multi-level program mode. In addition, the single voltage divider 210 is structured to divide a word line voltage in response to the step control signals STEPi in a single-level program mode. In other words, the single voltage divider of the word line voltage generator circuit 200, according to some embodiments of the present invention, is structured to divide a word line voltage in the multi-level and the single-level program modes. As previously mentioned, since an activation step of the step control signals STEPi is controlled differently according to the program mode, a voltage division ratio of the voltage divider 210 is also different according to the program mode. As a result, an increment of the word line voltage is set differently according to the program mode. For example, the word line voltage can be increased by 0.2 V every program loop during the multi-level program mode. In contrast, during the single-level program mode, the word line voltage can be increased by 0.8V every program loop.

In a non-volatile memory device having a multi-level program mode and a single-level program mode according to various embodiments of the present invention, it is possible to reduce a lay-out area by generating a word line voltage using the single voltage divider 210. In addition, a program characteristic can be improved by reducing or preventing problems when two voltage dividers are used.

In some embodiments, a step control signal generator circuit can comprise the step counter circuit 180 and the decoder circuit 190, which generate step control signals STEPi in response to a transition of the step count-up signal CNT_UP.

Figure 2:
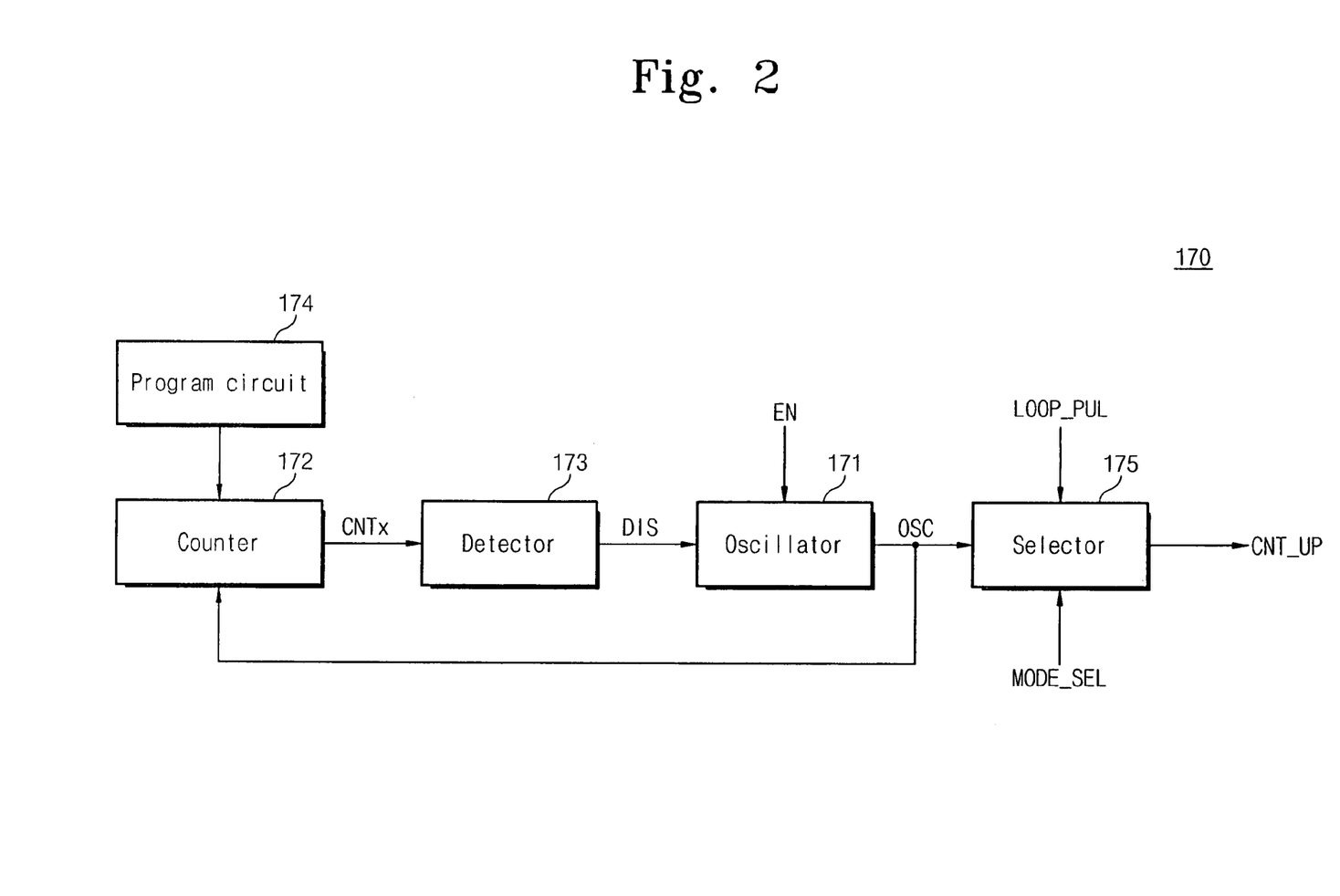
FIG. 2 is a block diagram of a step control circuit of FIG. 1 according to various embodiments of the present invention.

FIG. 2 is a block diagram showing a step control circuit of FIG. 1 according to various embodiments of the present invention. With reference to FIG. 2, a step control circuit 170 includes an oscillator 171, a counter 172, a detector 173, a program circuit 174 and a selector 175. The oscillator 171 generates an oscillation signal OSC in response to an enable signal EN from the control logic 160. As stated above, the enable signal EN becomes activated when the program loop is ended. After a predetermined time passes, the enable signal EN is deactivated. The counter 172 is synchronized with the oscillation signal OSC to perform a count operation. The detector 173 detects whether an output CNTx of the counter 172 reaches a target value. When the output CNTx of the counter 172 reaches the target value, the detector 173 activates a disable signal DIS. The oscillator 171 stops generating the oscillation signal OSC when the disable signal DIS is activated. An initial value of the counter 172 is set by a program circuit 174. The program circuit 174 can be embodied by a fuse circuit that is programmed to store the initial value of the counter 172. It will be understood in those skilled in the art that the program circuit 174 is not limited to the fuse circuit. For example, the program circuit 174 may be embodied so as to store an initial value using memory cells, a register and so forth.

Assuming that the counter 172 is a 3-bit counter, an output of the counter 173 is synchronized with the oscillation signal OSC. As a result, the output of the counter 173 may be sequentially increased from "000" to "111". In addition, assuming that the initial value of the counter 172 is set to "011" (3) by the program circuit, and a target value is "111" (7), the oscillation signal OSC of the oscillator 171 may be generated in 4 cycles. Additionally, assuming that the initial value of the counter 172 is set to "100" (4) by the program circuit 174, and the target value of the detector 173 is "111" (7), the oscillation signal OSC of the oscillator 171 may be generated in 3 cycles. In this embodiment, the counter 173 is embodied as an up-counter. However, it will be understood by those skilled in the art that the counter 173 may be embodied as a down-counter.

The selector 175 outputs the oscillation signal OSC or a loop pulse signal LOOP_PUL as a step count-up signal CNT_UP in response to a mode selection signal MODE_SEL. For instance, when the mode selection signal MODE_SEL indicates a multi-level program mode, the selector 175 outputs the loop pulse signal LOOP_PUL as the step count-up signal CNT_UP. Since the loop pulse signal LOOP_PUL generated in ending the program loop is output as a step count-up signal CNT_UP, the step count-up signal CNT_UP is transitioned one time in the multi-level program mode when the program loop is ended. In contrast, when the mode selection signal MODE_SEL indicates a single-level program mode, the selector 175 outputs the oscillation signal as the step count-up signal CNT_UP. Once the oscillation signal generated during an operation section of the oscillator 171 is output as the step count-up signal CNT_UP, the step count-up signal CNT_UP is successively transitioned N times when the program loop is ended. The oscillator 171 operates from an activation of the enable signal EN until an activation of the disable signal DIS.

Figure 3:
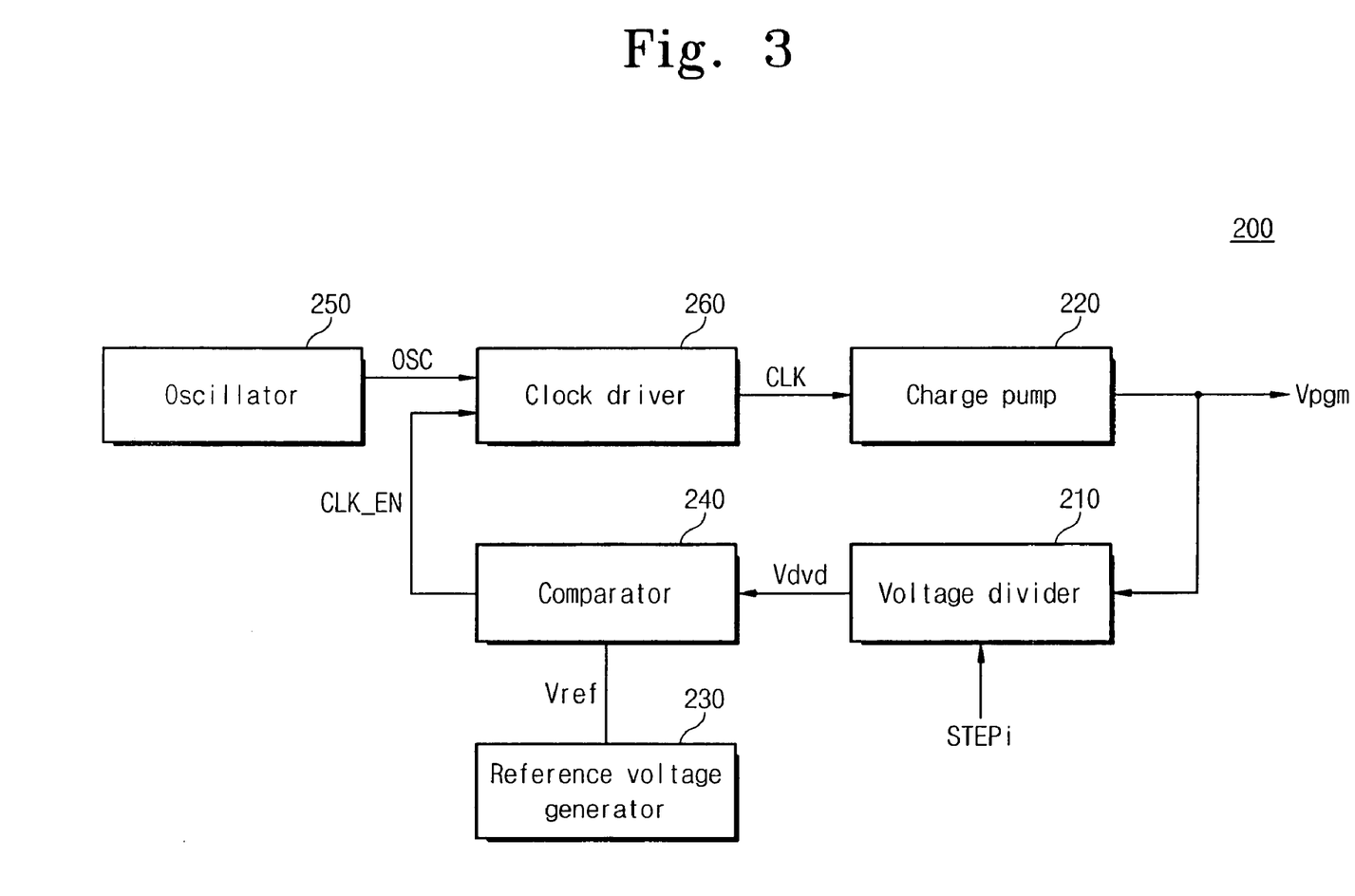
FIG. 3 is a block diagram of a word line voltage generator circuit of FIG. 1 according to various embodiments of the present invention.

FIG. 3 is a block diagram of a word line voltage generator circuit 200 of FIG. 1 according to various embodiments of the present invention. The word line voltage generator circuit 200 includes a voltage divider 210, a charge pump 220, a reference voltage generator 230, a comparator 240, an oscillator 250, and a clock driver 260.

The charge pump 220 generates a word line voltage Vpgm as a program voltage in response to a clock signal CLK. The voltage divider 210 divides the word line voltage Vpgm in response to step control signals STEPi and then outputs a divided voltage Vdvd. The comparator 240 compares the divided voltage Vdvd from the voltage divider 210 with a reference voltage Vref from the reference voltage generator 230. In response, the comparator 240 generates a clock enable signal CLK_EN as a comparison result. For instance, when the divided voltage Vdvd from the voltage divider 210 is lower than the reference voltage Vref from the reference voltage generator 230, the comparator 240 activates the clock enable signal CLK_EN. The clock driver 260 outputs the oscillation signal OSC from the oscillator 250 as the clock signal CLK in response to the clock enable signal CLK_EN. For example, when the clock enable signal CLK_EN is activated to high, the oscillation signal OSC is output as the clock signal CLK. This means that the charge pump 220 is operated. When the clock enable signal CLK_EN is deactivated to low, the oscillation signal is cut off so that the clock signal is not toggled. This means that the charge pump 220 is not operated.

Thus, through the above operations, when the word line voltage Vpgm is lower than a desired voltage, the clock signal CLK is operated so that the charge pump 220 is operated. When that the word line voltage Vpgm reaches a desired voltage, the clock signal CLK is not generated so that the charge pump 220 is not operated. Through these processes, a desired word line voltage is generated. In accordance with this feedback scheme, the word line voltage Vpgm may be increased by as much as an activation step. In other words, an increment of the word line voltage Vpgm is determined by the activation step of the step control signals STEPi. In some embodiments of the present invention, an activation step of the step control signals is set to "1" in the multi-level program mode and an activation step of the step control signals is set to "N" (where N is an integer greater than 1) in the single-level program mode.

Figure 4:
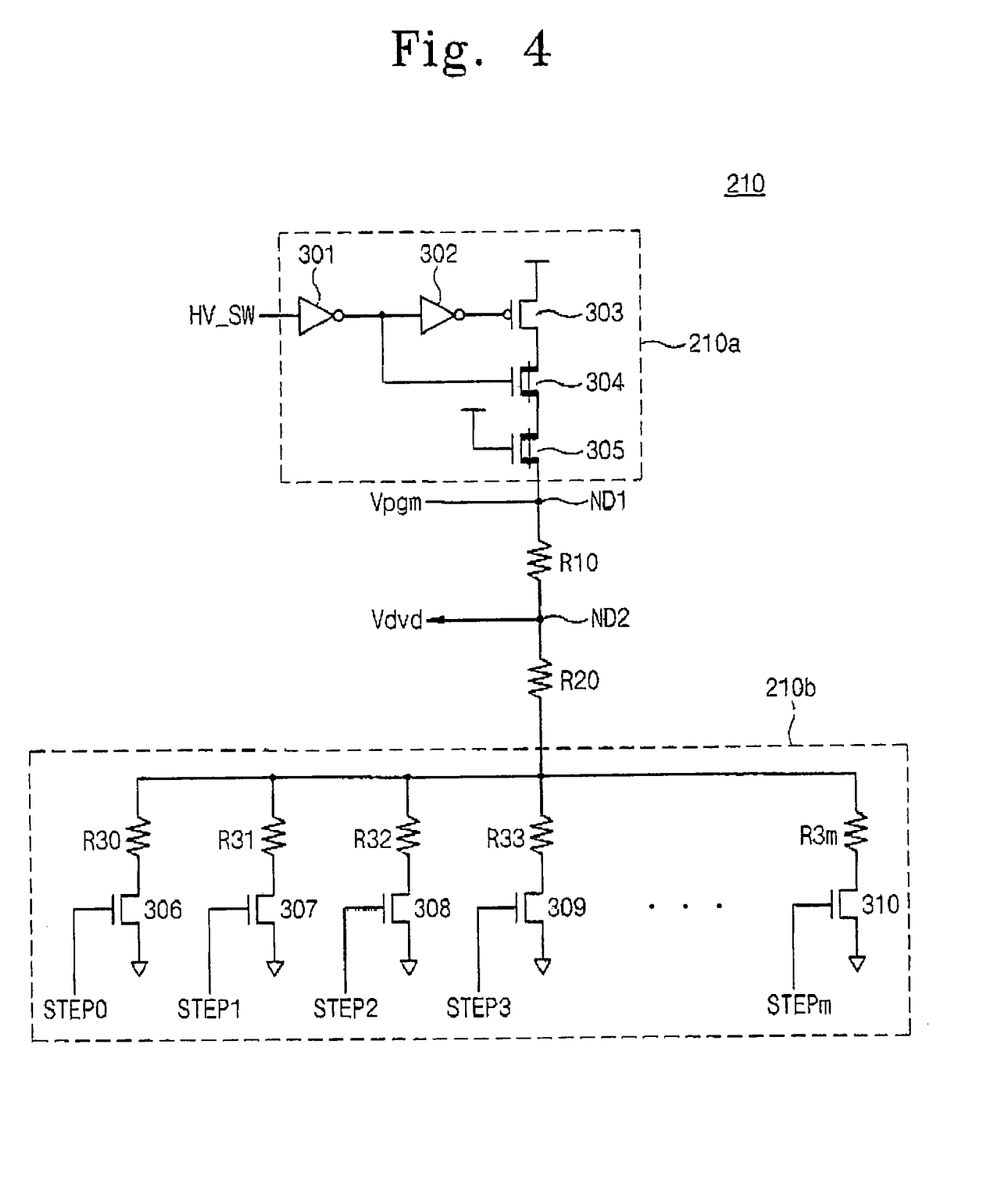
FIG. 4 is a circuit diagram of a voltage divider of FIG. 3 according to various embodiments of the present invention.

FIG. 4 is an exemplary circuit diagram of a voltage divider of FIG. 3 according to various embodiments of the present invention. With reference to FIG. 4, the voltage divider 210 includes a discharge section 210a, first and second resistors R10 and R20, and a variable resistance section 210b. The discharge section 210a is connected to an input terminal ND1 for receiving a word line voltage Vpgm and discharges a high voltage (word line voltage) of the input terminal ND1 to a power voltage in response to a control signal HV_SW. The discharge section 210a includes inverters 301 and 302, a PMOS transistor 303, and depletion mode NMOS transistors 304 and 305, which are connected as shown in FIG. 4. The depletion mode NMOS transistors 304 and 305 are well-known high-voltage transistors that can withstand a high voltage.

The first resistor R10 is connected between input terminal ND1 and output terminal ND2 that outputs the divided voltage Vdvd. The second resistor R20 is connected between the output terminal ND2 and the variable resistance section 210b. The variable resistance section 210b has a plurality of resistances. The resistances of the variable resistance section 210b are sequentially selected according to a sequential activation of step control signals STEPi. The variable resistance section 210b includes a plurality of resistors R30–R3m and a plurality of NMOS transistors 306–310, which are connected as shown in FIG. 4. The resistors R30–R3m correspond to the NMOS transistors 306–310. The NMOS transistors 306–310 are controlled by corresponding step control signals STEPi, respectively. Only one step control signal is activated in each program loop.

The divided voltage Vdvd is determined by a resistance of the resistor R10, and resistances of the resistor R20 and the variable resistance section 220b. The divided voltage Vdvd may be expressed by the following Equation (1):

$$Vdvd = Vpgm \frac{R2}{R1 + R2}, \quad \text{Equation (1)}$$

where R1 represents a resistance of the resistor R10, and R2 represents the sum of resistances of the resistor R20 and the variable resistance section 220b. The divided voltage Vdvd determined by Equation (1) is compared with the reference voltage Vref through the comparator 240. In accordance with a comparison result, the word line voltage Vpgm is increased by a pre-set increment. The word line voltage Vpgm may be expressed by the following Equation (2) obtained from the previous equation:

$$Vpgm = Vref\left(1 + \frac{R1}{R2}\right). \quad \text{Equation (2)}$$

As shown by Equation (2), the increment of the word line voltage Vpgm is in inverse ratio to the resistance R2. That is, the smaller the resistance R2 is, the higher the word line voltage Vpgm. In other words, as step control signals STEPi are sequentially activated, the resistance R2 is gradually decreased (a resistance of the variable resistance section 210b is gradually increased). This means that the word line voltage Vpgm is increased stepwise as much as the increment of the word line Vpgm.

Figure 5:
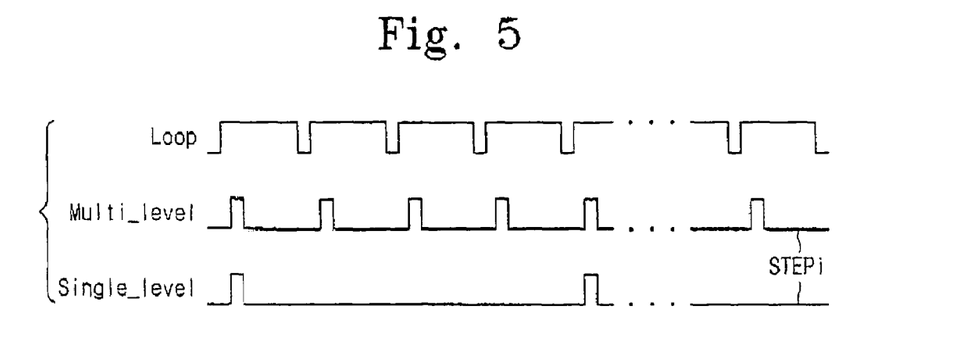
FIG. 5 is a timing diagram illustrating operations of a voltage divider of FIG. 4 according to various embodiments of the present invention.

As stated above, an activation step of the step control signals STEPi is set according to a program mode. For instance, in the first program loop, assume that the first step control signal STEPi is activated in a multi-level program mode and a single-level program mode. Further assume that an activation step value N of the step control signals is 3 in the single-level program mode. In accordance with these assumptions, as shown in FIG. 5, a step control signal STEPi is activated during the multi-level program mode in the second program loop. Moreover, a step control signal STEP3 is activated during the single-level program mode in the second program loop. Accordingly, since a variation (or an increment) of the resistance R2 is different according to a program mode, the increment of the word line voltage Vpgm is also different according to a program mode.

Figure 6:
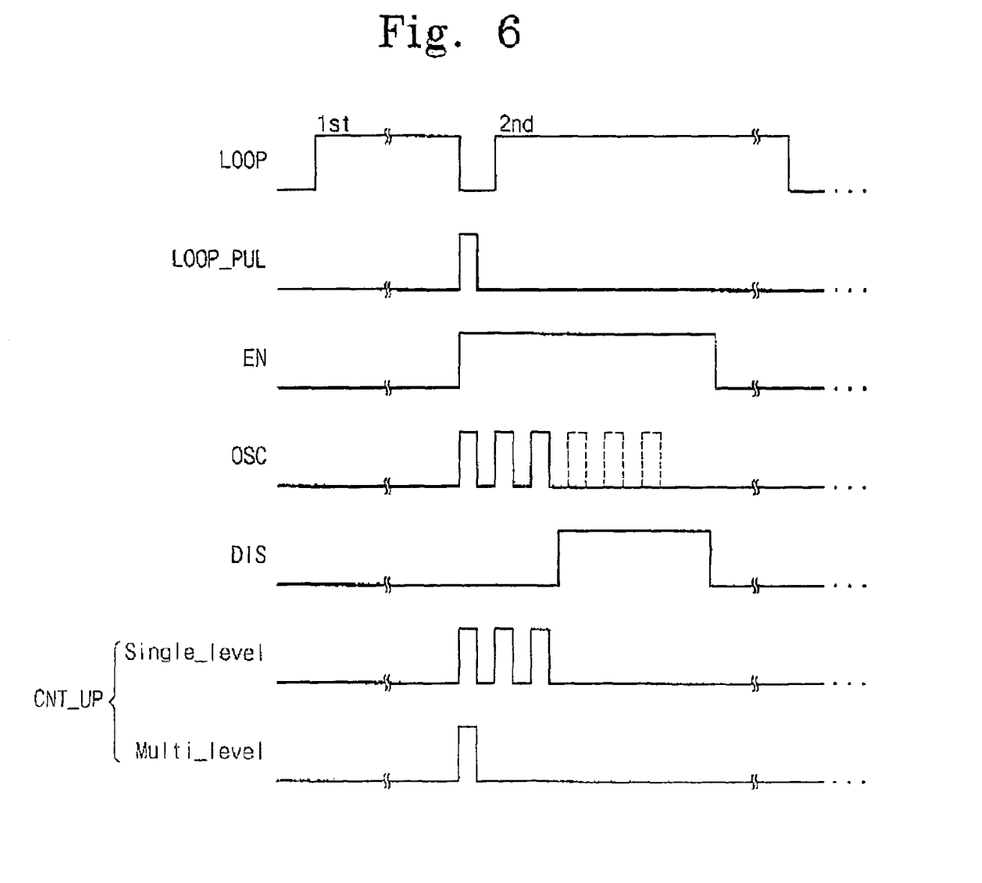
FIG. 6 is a timing diagram illustrating operations of non-volatile memory devices according to various embodiments of the present invention.

FIG. 6 is a timing diagram illustrating operations of non-volatile memory devices according to various embodiments of the present invention. As is well known, in the case of a non-volatile memory device such as a NAND-type flash memory device, a program cycle includes a plurality of program loops. Each of the program loops includes a program section and a program verification section. Before performing the program operation, data to be programmed is loaded to a sense amplification and a latch circuit 130. Then, a program command is provided to the non-volatile memory device so that a multi-level or single-level program operation is performed.

The control logic 160 activates a control signal HV_SW to high in response to an input of a program command. As a result, an input node ND1 of the voltage divider 210 is electrically disconnected from a power supply voltage. In this case, a step control signal STEP0 is activated through a step counter 180 and a decoder circuit 190 during the first program loop. As the step control signal STEP0 becomes activated, the program voltage Vpgm may be determined by Equation (2). If the word line voltage Vpgm reaches a desired voltage level, memory cells may be programmed in a well-known manner. If a program operation of the first program loop is ended, a program verification operation is performed. In the program verification operation, the sense amplification and latch circuit 130 reads data from the memory cell array 110 and then outputs the read data to the pass/fail check circuit 150. The pass/fail check circuit 150 determines whether data values from the sense amplification and latch circuit 130 have the same data, that is, a pass data value or not. If any one of the data values has the pass data value, the control logic activates the loop pulse signal LOOP_PUL. That is, as shown in FIG. 6, the control logic 160 activates the loop pulse signal LOOP_PUL as a pulse in response to an end of the first program loop.

If the mode selection signal MODE_SEL indicates the multi-level program mode, the selector 175 of the step control circuit 170 outputs the loop pulse signal LOOP_PUL as the step count-up signal CNT_UP. That is, the step count-up signal CNT_UP is activated one time in the multi-level program mode, and an output value of the counter circuit 180 is increased by "1". The decoder 190 decodes the output value of the counter circuit 180 to activate the step control signal STEP1. The word line voltage generator circuit 200 increases the word line voltage by a pre-set increment (e.g., 0.2V) in response to an activation of the step control signal STEP 1. That is, as the resistance R2 of the voltage divider 210 becomes small, the word line voltage Vpgm is increased by a pre-set increment. The multi-level program operation explained above may be repeated until all data values have pass data values.

In the event that the mode selection signal MODE_SEL indicates a single-level program mode, the selector 175 of the step control circuit 170 outputs an oscillation signal OSC as the step count-up signal CNT_UP. During the single-level program mode, the oscillation signal OSC may be generated through the following processes: The oscillator 171 starts generating the oscillation signal OSC in response to an activation of an enable signal EN from the control logic 160. The counter 172 is synchronized with the oscillation signal OSC to perform a count operation. In this embodiment, the counter 173 is 3-bit counter, and an initial value of the counter 173 is set to "100" (4) by a program circuit 174. A target value of the detector 173 is "111" (7). The oscillator 171 generates the oscillation signal OSC until a disable signal DIS is activated. When an output value CNTx of the counter 172 is "111", the disable signal DIS is activated.

Thus, when an initial value of the counter 172 is set to "100" (4) by a program circuit, as shown in FIG. 6, the oscillation signal OSC may be generated in only 3 cycles. That is, as shown in FIG. 6, the step count-up signal CNT_UP is successively transitioned three times in the second program loop in the single-level program mode. The word line voltage generator circuit 200 increases a word line voltage by a pre-set increment (e.g., 0.8V) in response to an activation of the step control signal STEP3. In other words, as the resistance R2 of the voltage divider 210 becomes small, the word line voltage Vpgm is increased by a pre-set increment. The single-level program as stated above may be repeated until all data values from the sense amplification and latch circuit 130 have pass data values.

As previously mentioned, it is possible to reduce a layout by generating a word line voltage for multi-level and single-level program operations using a single voltage divider, according to some embodiments of the present invention. In addition, a program characteristic can be improved by reducing or preventing a problem (such as a ripple phenomenon of a word line voltage) when the single voltage divider is used.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. A non-volatile memory device comprising:
   a word line voltage generator circuit that is configured to generate a word line voltage in response to step control signals; and
   a word line voltage control circuit that is configured to control an activation step of the step control signals such that an increment of the word line voltage is changed by the word line voltage generator circuit according to multi-level and single-level program modes of the non-volatile memory device.

2. The non-volatile memory device of claim 1, wherein the activation step of the step control signals is set by the word line voltage control circuit to "1" or "N", where, N is an integer greater than 1, during the multi-level program mode or the single-level program mode, respectively, such that the increment of the word line voltage is changed by the word line voltage generator circuit according to the multi-level and the single level program modes.

3. The non-volatile memory device of claim 1, wherein the word line voltage generator circuit includes a single voltage divider that is configured to divide the word line voltage during the multi-level and single-level program modes.

4. The non-volatile memory device of claim 3, wherein the single voltage divider is responsive to the step control signals.

5. The non-volatile memory device of claim 1, wherein the word line voltage is increased stepwise when program loops of a program cycle are repeated.

6. The non-volatile memory device of claim 1, wherein the increment of the word line voltage in the single-level program mode is larger than the increment of the word line in the multi-level program mode.

7. A non-volatile memory device comprising:
   a word line voltage generator circuit that is configured to generate a word line voltage in response to step control signals;
   a step control circuit that is configured to generate a step counter-up signal in response to a loop pulse signal indicating pass/fail of a program loop; and
   a step control generator circuit that is configured to sequentially activate the step control signals in response to a transition of the step counter-up signal, wherein the step pulse signal is successively transitioned at one or N, where N is an integer greater than 1, times, when the program loop is ended so that an increment of the word line voltage is changed by the word line voltage generator circuit according to the program mode of the non-volatile memory device.

8. The non-volatile memory device of claim 7, wherein the transition of the step counter-up signal is a low-high transition or a high-low transition.

9. The non-volatile memory device of claim 7, wherein the word line voltage generator circuit includes a single voltage divider that is configured to divide the word line voltage in a multi-level program mode and a single-level program mode.

10. The non-volatile memory device of claim 9, wherein the single voltage divider is responsive to the step control signals.

11. The non-volatile memory device of claim 7, wherein the word line voltage is increased stepwise when program loops of a program cycle are repeated.

12. The non-volatile memory device of claim 7, wherein the increment of the word line in a single program mode is larger than the increment of the word line voltage in a multi-level program mode.

13. The non-volatile memory device of claim 7, wherein the step control circuit is configured to set the increment of the word line voltage that is generated in a single-level program mode.

14. The non-volatile memory device of claim 7, wherein the step control circuit includes:
    an oscillator that is configured to generate an oscillation signal in response to an end of a program loop;
    a counter that is configured to perform a count operation in response to the oscillation signal;
    a detector that is configured to deactivate the oscillator when an output of the counter reaches a target value; and
    a selector that is configured to output an oscillation signal as the step counter-up signal, wherein the oscillation signal is generated during operation of the oscillator in the single-level program mode.

15. The non-volatile memory device of claim 14, wherein the selector is configured to output the loop pulse signal as the step counter-up signal in the multi-level program mode.

16. The non-volatile memory device of claim 15, wherein the loop pulse signal is transitioned when the program loop is ended.

17. The non-volatile memory device of claim 14, wherein the step control circuit further includes an initial value set circuit that is configured to set an initial value of the counter.

18. The non-volatile memory device of claim 16, wherein the initial value set circuit comprises a fuse circuit that is programmed to store the initial value.

19. The non-volatile memory device of claim 7, further comprising:
    an array of memory cells arranged in row and columns;
    a row decoder circuit that is configured to provide the word line voltage to one of the rows;
    a data read circuit that is configured to read data from the array during a program verification of a program loop;

a pass/fail check circuit that is configured to determine a pass/fail of the program loop in response to the read data; and control logic that is configured to generate the loop pulse signal in response to an output of the pass/fail check circuit.

20. A method of controlling a word line voltage of a non-volatile memory device comprising:

generating a step counter-up signal in response to a loop pulse signal indicating a pass/fail of a program loop;

sequentially activating step control signals in response to a transition of the step counter-up signal; and generating a word line voltage in response to the step control signals, wherein the loop pulse signal is successively transitioned at one or N, where N is an integer greater than 1, times, according to a program mode when a program loop is ended such that an increment of a word line is changed according to the program mode.

21. A method of claim 20, wherein the program mode includes a multi-level program mode and a single-level program mode.

22. A non-volatile memory device comprising:

a plurality of non-volatile memory cells, a respective one of which is configured to store a single bit in a single bit mode and to store more than one bit in a multi-bit mode; and a programming circuit that is configured to program the non-volatile memory cells using a first series of sequentially increasing program voltage steps in the single bit mode and using a second series of sequentially increasing program voltage steps in the multi-bit mode.

23. The non-volatile memory device of claim 22 wherein the programming circuit includes a single voltage divider that is configured to generate the first series of sequentially increasing program voltage steps in the single bit mode and to generate the second series of sequentially increasing program voltage steps in the multi-bit mode.

24. A non-volatile memory device comprising:

a plurality of non-volatile memory cells, a respective one of which is configured to store a single bit in a single bit mode and to store more than one bit in a multi-bit mode; and a single voltage divider that is configured to generate at least a first program voltage for the non-volatile memory cells in the single bit mode and to generate at least a second program voltage that is different from the first program voltage, for the non-volatile memory cells in the multi-bit mode.

25. A method of programming a non-volatile memory device that includes a plurality of non-volatile memory cells, a respective one of which is configured to store a single bit in a single bit mode and to store more than one bit in a multi-bit mode, the method comprising:

generating a first series of sequentially increasing program voltage steps to program the non-volatile memory cells in the single bit mode; and generating a second series of sequentially increasing program voltage steps to program the non-volatile memory cells in the multi-bit mode.

26. The method of claim 25 wherein generating a first series of sequentially increasing program voltage steps and generating a second series of sequentially increasing program voltage steps are performed by a single voltage divider.

27. A method of programming a non-volatile memory device that includes a plurality of non-volatile memory cells, a respective one of which is configured to store a single bit in a single bit mode and to store more than one bit in a multi-bit mode, the method comprising:

generating, by a single voltage divider, at least a first program voltage for the non-volatile memory cells in the single bit mode and at least a second program voltage that is different from the first program voltage, for the non-volatile memory cells in the multi-bit mode.

* * * * *